(12) United States Patent  
Kim et al.

(10) Patent No.: US 11,611,016 B2  
(45) Date of Patent: Mar. 21, 2023

(54) PIXEL OF MICRO DISPLAY HAVING INCLINED SIDE

(71) Applicant: SUNDIODE KOREA, Seoul (KR)

(72) Inventors: James Chinmo Kim, Mountain View, CA (US); Sungsoo Yi, Sunnyvale, CA (US)

(73) Assignee: SUNDIODE KOREA

( * ) Notice: Subject to any disclaimer, the term of this patent is extended or adjusted under 35 U.S.C. 154(b) by 0 days.

(21) Appl. No.: 17/234,782

(22) Filed: Apr. 19, 2021

(65) Prior Publication Data

US 2021/0336083 A1    Oct. 28, 2021

(30) Foreign Application Priority Data

Apr. 23, 2020    (KR) .......................... 10-2020-0049352

(51) Int. Cl.  
*H01L 33/14*    (2010.01)  
*H01L 33/32*    (2010.01)  
*H01L 33/04*    (2010.01)  
*H01L 27/15*    (2006.01)

(52) U.S. Cl.  
CPC .......... *H01L 33/145* (2013.01); *H01L 27/156* (2013.01); *H01L 33/04* (2013.01); *H01L 33/32* (2013.01)

(58) Field of Classification Search  
CPC ..... H01L 27/156; H01L 33/145; H01L 33/04; H01L 33/32  
See application file for complete search history.

(56) References Cited

U.S. PATENT DOCUMENTS

| | | | |
|---|---|---|---|
| 2017/0117259 A1* | 4/2017 | Xu | .......................... H01L 33/32 |
| 2017/0162746 A1* | 6/2017 | Cha | .......................... H01L 33/10 |
| 2019/0207043 A1* | 7/2019 | Yonkee | ............ H01L 21/02579 |
| 2020/0212262 A1* | 7/2020 | Jang | ........................ H01L 33/62 |
| 2020/0371278 A1* | 11/2020 | Kondo | ...................... F21V 9/30 |

* cited by examiner

*Primary Examiner* — Mark W Tornow  
(74) *Attorney, Agent, or Firm* — Renaissance IP Law Group LLP

(57) ABSTRACT

Disclosed is a unit pixel of a micro-display capable of minimizing light emitted through a side surface. A side surface of the unit pixel having a vertically stacked pixel structure is etched and has inclination angle. Light directed toward the side surface is reflected by the side surface inclined at an angle, and the light is emitted in a direction perpendicular to the growth surface or the surface of the growth substrate.

10 Claims, 5 Drawing Sheets

PIXEL OF MICRO DISPLAY HAVING INCLINED SIDE

TECHNICAL FIELD

The present disclosure relates to a pixel structure of a micro-display, and more particularly, to a pixel of a micro-display having an inclined side surface and minimizing emission through the side surface of the pixel.

BACKGROUND ART

A micro-display is a display implemented by singulating light emitting diodes (LEDs) manufactured on a wafer into pixels and then reassembling the individual pixels. That is, the manufacturing process of the micro-display has a process of manufacturing a wafer having light emitting diodes for pixels, singulating the wafer into pixels and transferring the individual pixels to a display substrate. That is, red, green, and blue sub-pixels are fabricated separately on a separate substrate through a conventional LED manufacturing process. Each of the manufactured wafers are singulated into respective sub-pixels, and the sub-pixels are then applied to a display substrate through a pick-and-place process.

Accordingly, in a micro-display, one pixel is composed of a combination of red, green, and blue light emitting diodes, and each of these light emitting diodes is disposed at adjacent, non-overlapping positions to form one pixel.

The conventional pixel structure of a micro-display has several manufacturing difficulties for application. One of the difficulties is a necessity for a transfer process that makes the manufacturing process very challenging. In particular, there is a problem in which large space is needed to position sub-pixels from one another. Furthermore, it is very difficult to repair defective pixels.

In order to solve the above-mentioned problems, the inventors of the present disclosure have proposed a pixel structure of a micro-display having a vertically stacked pixel structure in Korean Patent Application No. 10-2019-0164263.

The stacked pixel structure can be realized with sub-pixels of red, green, and blue in one vertically stacked structure, thus making the area occupied by one pixel to be the same as the area occupied by each sub-pixel, so that an easy transfer process can be implemented. Furthermore, for defective pixels, repairs can be easily performed.

A black matrix or the like needs to be introduced between pixels to prevent light from leaking from one pixel onto other surrounding pixels. However, even with a black matrix, light emitted through side surfaces of a pixel is not reflected back at the surface, and the light is thus absorbed by the black matrix. Accordingly, the light emission efficiency of light emitted through the front of the pixel for viewing is reduced and lost due to the light emitted through the sides, as compared to the input power to drive the display.

SUMMARY

The present disclosure is directed to provide a unit pixel of a micro-display capable of minimizing the light emitted through the sides of the unit pixel.

One aspect of the present disclosure provides an unit pixel of a micro-display. The unit pixel of a micro-display comprises a first sub-pixel emitting blue light formed on a growth substrate, a first current blocking layer formed on the first sub-pixel and blocking leakage current to or from the first sub-pixel, a second sub-pixel formed on the first current blocking layer and emitting green light, a second current blocking layer formed on the second sub-pixel and blocking leakage current to or from the second sub-pixel, and a third sub-pixel formed on the second current blocking layer and emitting red light, wherein inclined surface of the first sub-pixel, the second sub-pixel and the third sub-pixel has inclination angle with respect to a vertical line that is perpendicular to the plane of the growth substrate, and when light generated in one of the sub-pixels is incident on the inclined surface, the light is reflected.

Another aspect of the present disclosure provides an unit pixel of a micro-display. The unit pixel comprises a first sub-pixel formed on a growth substrate and emitting blue light, a first current blocking layer formed on the first sub-pixel and blocking leakage current to or from the first sub-pixel, a second sub-pixel formed on the first current blocking layer and emitting green light, a second current blocking layer formed on the second sub-pixel and blocking leakage current to or from the second sub-pixel, and a third sub-pixel formed on the second current blocking layer and emitting red light, wherein a via hole penetrating the second sub-pixel and the third sub-pixel is formed, an inner inclined surface is formed on a side surface of the via hole, and the inner inclined surface has an inclination angle.

According to the present disclosure, the side surface of the unit pixel has a predetermined inclination angle with respect to the surface of the growth substrate. Due to the inclination angle, the cross-sectional area of the active layer formed at the upper region of the unit pixel is smaller than the cross-sectional area of the active layer formed at the lower region of the unit pixel. The probability that light formed in the active layer is emitted through the side of the unit pixel decreases, and the probability that light is emitted in a direction that is vertical to the growth substrate increases significantly due to the internal reflection at the inclined side surface. Through the above-mentioned structure, light emission efficiency in the vertical direction of the unit pixel may be increased.

In addition, in the present disclosure, a via hole is formed in one unit pixel, and the inner sidewall of the unit pixel has a certain inclination angle with respect to a line that is vertical with respect to the growth substrate. Light emitted through the side is minimized due to the inclination angle formed at the inner sidewall, and the light emission efficiency in the vertical direction is increased. In addition, heat generated during the light emission operation is easily dissipated through the via hole formed therein, and reliability of the unit pixel is also improved.

DETAILED DESCRIPTION

Hereinafter, embodiments of the present disclosure will be described in detail with reference to the accompanying drawings.

While the present disclosure is susceptible to various modifications and alternative forms, specific embodiments thereof are shown by way of example in the drawings and will herein be described in detail. However, it should be understood that there is no intent to limit the disclosure to the particular forms disclosed, but rather the disclosure is to cover all modifications, equivalents, and alternatives falling within the spirit and scope of the disclosure defined by the appended claims.

When an element such as a layer, a region, and a substrate is referred to as being disposed "on" another element, it should be understood that the element may be directly formed on the other element or an intervening element may be interposed therebetween.

It should be understood that although the terms "first," "second," etc. may be used herein to describe various elements, components, areas, layers, and/or regions, these elements, components, areas, layers, and/or regions are not limited by these terms.

First Embodiment

Figure 1:
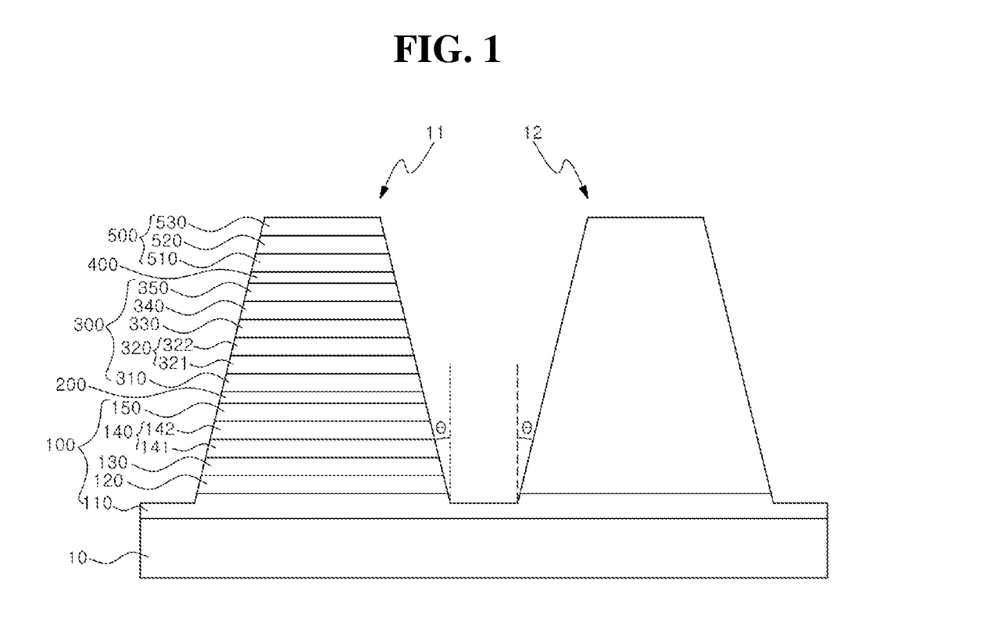
FIG. 1 is a cross-sectional view of unit pixels according to a first embodiment of the present disclosure.

FIG. 1 is a cross-sectional view of unit pixels according to a first embodiment of the present disclosure.

Referring to FIG. 1, two unit pixels 11, 12 are disposed on a growth substrate 10. The unit pixels 11, 12 have the same structure and shape. Hereinafter, unit pixel 11 will be described.

The unit pixel 11 includes a first sub-pixel 100 on the growth substrate 10, a first current blocking layer 200, a second sub-pixel 300, a second current blocking layer 400 and a third sub-pixel 500.

The first sub-pixel 100 is formed on the growth substrate 10, and it is preferable for the first sub-pixel 100 to form blue light. To form blue light, the first n-type semiconductor layer 110, the first active layer 120, and the first p-type semiconductor layer 130 are formed.

First, the first n-type semiconductor layer 110 is formed on the growth substrate 10. The first n-type semiconductor layer 110 is made of GaN, and is preferably doped with Si. The first n-type semiconductor layer 110 functions as a common electrical contact commonly used by the adjacent unit pixels 12. That is, the disclosed plurality of unit pixels 11, 12 share the first n-type semiconductor layer 110.

The first active layer 120 is formed on the first n-type semiconductor layer 110, and the first active layer 120 has a multi-quantum well structure having an InGaN material capable of emitting blue light. In addition, a first p-type semiconductor layer 130 is formed on the first active layer 120, and it is preferable that Mg is used as a dopant for the GaN material of the first p-type semiconductor layer 130.

The first current blocking layer 200 is formed on the first p-type semiconductor layer 130. In addition, a first tunnel junction layer 140 and a first contact layer 150 may be further formed between the first p-type semiconductor layer 130 and the first current blocking layer 200. The first tunnel junction layer 140 may be formed on the first p-type semiconductor layer 130. The first tunnel junction layer 140 has a first heavily doped p-type semiconductor layer 141 and a first heavily doped n-type semiconductor layer 142 formed on the first p-type semiconductor layer 130. In addition, a first contact layer 150 made of an n-type semiconductor is formed on the first tunnel junction layer 140.

In particular, a reverse bias is applied to the first tunnel junction layer 140 in the direction of the first active layer 120. When a reverse bias is applied to the two heavily doped semiconductor layers 141 and 142, a tunneling phenomenon occurs at the tunnel junction, and a current supplied to the first active layer 120 can be evenly distributed via the tunnel junction. In particular, the first heavily doped n-type semiconductor layer 142 having high conductivity evenly distributes current and forms an equipotential, so that the current dispersed by the tunneling phenomenon may be supplied to the first active layer 120.

The first current blocking layer 200 formed on the first sub-pixel 100 may have a p-type conductivity, or may be formed of a non-conductor such as Fe-doped GaN or SiO2. The first current blocking layer 200 is preferably formed of a p-type GaN material. Fe-doped GaN or p-type GaN may be easily formed on the lower first contact layer 150, which act as a growth template for the subsequent layers during the continuous process of MOCVD. When a bias is applied to the first active layer 120 through the first contact layer 150 formed of n-type GaN, a leakage current that may flow to the first sub-pixel 100 or the second sub-pixel 300 is blocked by the first current blocking layer 200.

The second sub-pixel 300 is formed on the first current blocking layer 200. Preferably, the second sub-pixel 300 forms green light. In order to form green light, the second sub-pixel 300 has a second p-type semiconductor layer 330, a second active layer 340, and a second n-type semiconductor layer 350.

The second p-type semiconductor layer 330 and the second n-type semiconductor layer 350 are made of a GaN material, and the second n-type semiconductor layer 350 has Si as a dopant, and the second p-type semiconductor layer 330 may have Mg as a dopant. In addition, the second active layer 340 has a multi-quantum well structure having an InGaN material, and the fraction of In (indium) contained in the well layer is preferably set larger than that contained in the well layer of the first active layer 120.

In addition, a second contact layer 310 and a second tunnel junction layer 320 may be further formed between the first current blocking layer 200 and the first p-type semiconductor layer 330. The second contact layer 310 is preferably formed of n-type GaN that is the same material as the first contact layer 150. In addition, a second tunnel junction layer 320 is formed on the second contact layer 310. The second tunnel junction layer 320 has a second heavily doped n-type semiconductor layer 321 and a second heavily doped p-type semiconductor layer 322 sequentially formed, so that a reverse bias is applied between the second contact layer 310 and the second p-type semiconductor layer 330.

In particular, a bias is applied to the second contact layer 310 to supply current to the second active layer 340.

The second p-type semiconductor layer 330, the second active layer 340, and the second n-type semiconductor layer 350 are sequentially stacked on the second tunnel junction layer 320.

In addition, the second current blocking layer 400 is formed on the second sub-pixel 300 described above. The second current blocking layer 400 may be formed of an insulating adhesive or Fe-doped GaN. In addition, the second current blocking layer 400 may be GaN doped with Mg. When the second current blocking layer 400 is formed of Mg-doped GaN, a reverse bias state is implemented with the second n-type semiconductor layer 350, so that current from the second n-type semiconductor layer 350 to the third sub-pixel 500 can be blocked. According to the above-described configuration, the second current blocking layer 400 blocks leakage current that may flow to the second sub-pixel 300 or the third sub-pixel 500.

When the second current blocking layer 400 is formed of an insulating adhesive, it is preferable that the third sub-pixel 500 is fabricated on another growth substrate and then bonded to the second sub-pixel 300 with the insulating adhesive. For example, a third n-type semiconductor layer 530, a third active layer 520, and a third p-type semiconductor layer 510 are sequentially formed on a GaAs substrate. The third n-type semiconductor layer 530 and the third p-type semiconductor layer 510 have an AlInGaP material, the third n-type semiconductor layer 530 uses Si as a dopant, and the third p-type semiconductor layer 510 uses Mg as a dopant. In addition, the third active layer 520 has an AlInGaP material, and implements red light by controlling the fraction of In. The third sub-pixel 500 formed on another growth substrate such as GaAs is attached to an insulating adhesive, and in a subsequent process, the growth substrate which is made of GaAs may be dissolved in an acidic solution and removed. Through this, the third sub-pixel 500 may be formed on the second current blocking layer 400.

In addition, when the second current blocking layer 400 is Fe-doped GaN, the third p-type semiconductor layer 510, the third active layer 520, and the third n-type semiconductor layer 530 made of GaN may be formed through a conventional MOCVD process. That is, a third p-type semiconductor layer 510 is formed on the second current blocking layer 400, and a third active layer 520 having a multi-quantum well structure having an InGaN material is formed on the third p-type semiconductor layer 510, and the third n-type semiconductor layer 530 is formed on the third active layer 520. In addition, the third n-type semiconductor layer 530, the third active layer 520, and the third p-type semiconductor layer 510 may be sequentially formed on the second current blocking layer 400 according to the embodiment.

In FIG. 1, the first n-type semiconductor layer 110, the second n-type semiconductor layer 350, and the third n-type semiconductor layer 530 are electrically shorted together through appropriate means. For example, holes reaching the first n-type semiconductor layer 110, the second n-type semiconductor layer 350, and the third n-type semiconductor layer 530 are formed by etching, and via contacts are formed through metal filling of the holes. More specifically, the side surfaces of the via contacts are coated with an insulating material, and via contacts are electrically connected to the respective n-type semiconductor layers 110, 350, 530. In addition, when metal wiring is formed to be electrically connected to the via contacts on the top layer, the first n-type semiconductor layer 110, the second n-type semiconductor layer 350 and the third n-type semiconductor layer 530 are electrically shorted together.

In addition, separate electrical contacts are formed on the first contact layer 150, the second contact layer 310, and the third p-type semiconductor layer 510 to form three separate anodes.

In the above-described structure, adjacent pixels share the first n-type semiconductor layer 110. Therefore, the first n-type semiconductor layer 110, the second n-type semiconductor layer 350, and the third n-type semiconductor layer 530 of all adjacent pixels are all electrically shorted together.

Further, each of the pixels 11, 12 has an inclination angle θ of 24° to 29° with respect to a vertical line that is perpendicular to the surface of the growth substrate 10. That is, the side surfaces formed by the first sub-pixel 100, the second sub-pixel 300, and the third sub-pixel 500 have an inclination angle θ of 24° to 29° with a vertical line that is perpendicular to the growth substrate 10.

Figure 2:
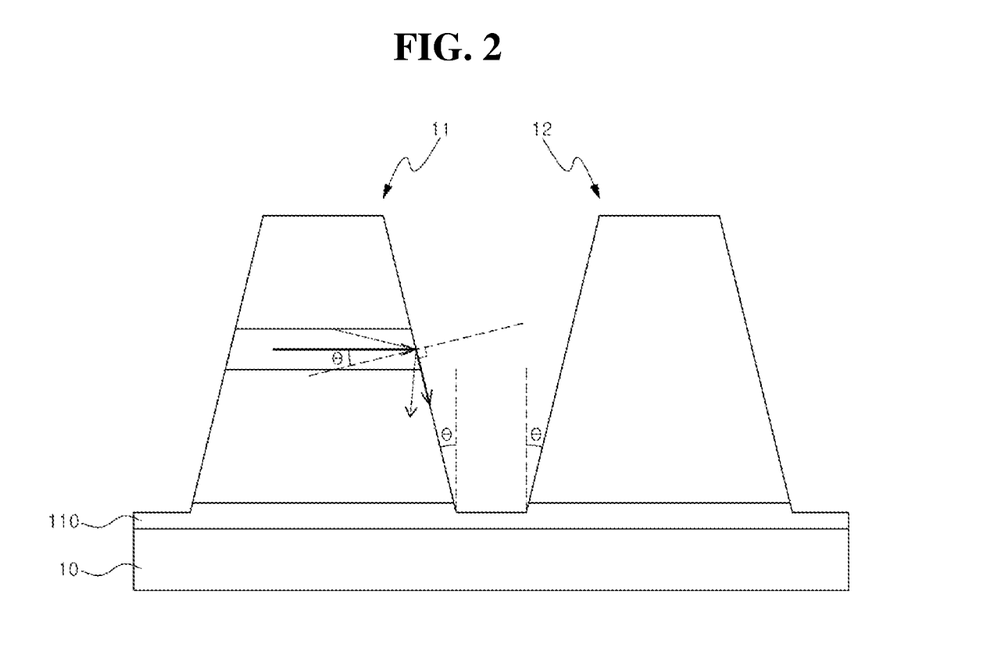
FIG. 2 is a conceptual diagram for explaining the optical behavior of a unit pixel according to a first embodiment of the present disclosure.

FIG. 2 is a conceptual diagram for explaining the optical behavior of a unit pixel according to a first embodiment of the present disclosure.

Referring to FIG. 2, an angle formed by the side surface of unit pixel 11 with a vertical line that is perpendicular to the surface of the growth substrate 10 or the first n-type semiconductor layer 110 is an inclination angle θ. In addition, when light formed in an active layer is incident on the side surface, the incident angle of the light on the side surface of the unit pixel 11 also becomes θ.

The incident angle θ at which total internal reflection occurs in the GaN material is 25°, and the incident angle θ where total reflection occurs in the AlInGaP material is 18°. The absolute refractive indexes for GaN and AlInGaP are 2.4 and 3.3, respectively. That is, when the incident angle is greater than the angle of incidence at which total internal reflection occurs, light suffers total internal reflection, and the light formed in the active layer is not emitted through the side surface of the unit pixel 11 and is reflected toward the upper or lower surface of the unit pixel 11.

Particularly, in the present disclosure, since the unit pixel 11 has an inclination of 24° to 29° with a vertical line that is perpendicular to the surface of the growth substrate 10, the inclination angle becomes the incident angle at the side surface of the unit pixel in the active layer. Therefore, most of the light formed in the active layer is reflected and light emitted through the side surface can be minimized.

Figure 3:
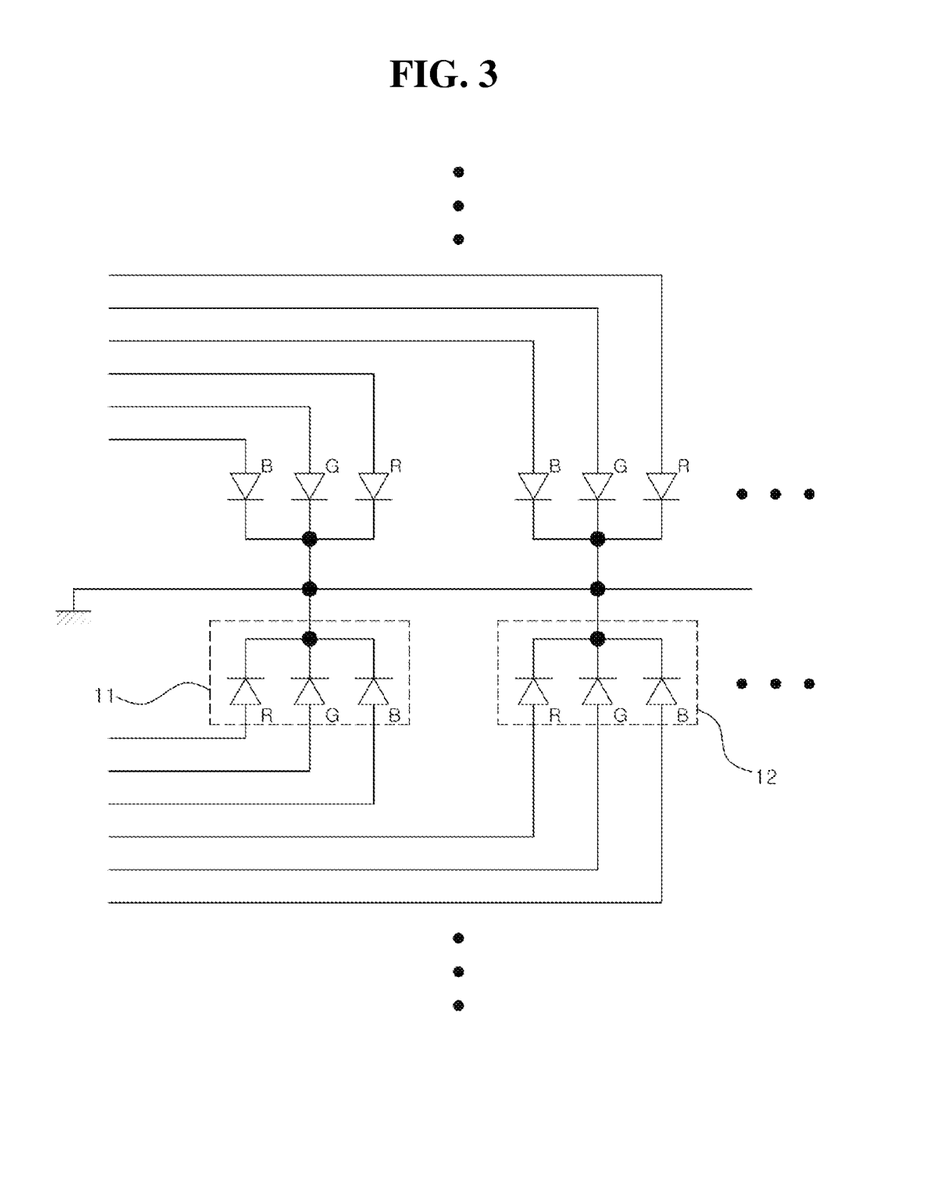
FIG. 3 is an equivalent circuit diagram of the unit pixels in FIG. 1 according to the first embodiment of the present disclosure.

FIG. 3 is an equivalent circuit diagram of the unit pixels in FIG. 1 according to the first embodiment of the present disclosure.

Referring to FIG. 3, the unit pixel 11 is composed of three sub-pixels R, G, and B. Each sub-pixel R, G, or B is represented by a diode. In particular, the cathodes of the diodes are connected in common. The common connection between cathodes is equivalent to the first n-type semiconductor layer 110 in FIG. 1. It is preferable that the cathode of the unit pixel 11 is electrically connected to the cathode of the adjacent unit pixel 12 and to the cathodes of all unit pixels. In particular, it is preferable that the cathode is grounded.

Further, voltages for determining the brightness of the sub-pixels are applied to the three anode terminals of the sub-pixels R, G, and B. The voltages applied to the anode terminals are individually applied to each sub-pixel.

Through the above-described structure, brightness and color of the micro-display can be controlled, and implement a display operation.

Figure 4:
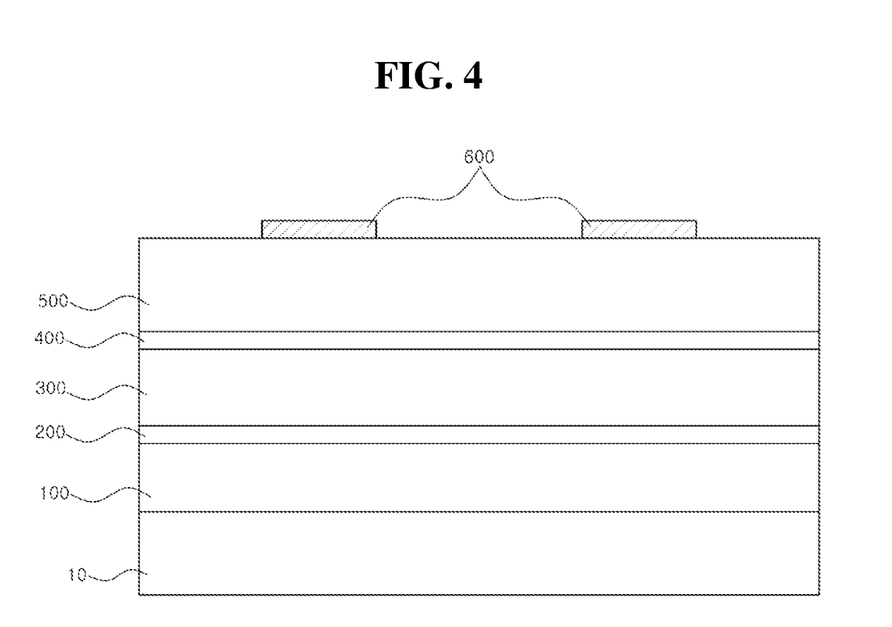
FIGS. 4 and 5 are cross-sectional views illustrating a manufacturing process of the unit pixel in FIG. 1 according to a first embodiment of the present disclosure.
Figure 5:
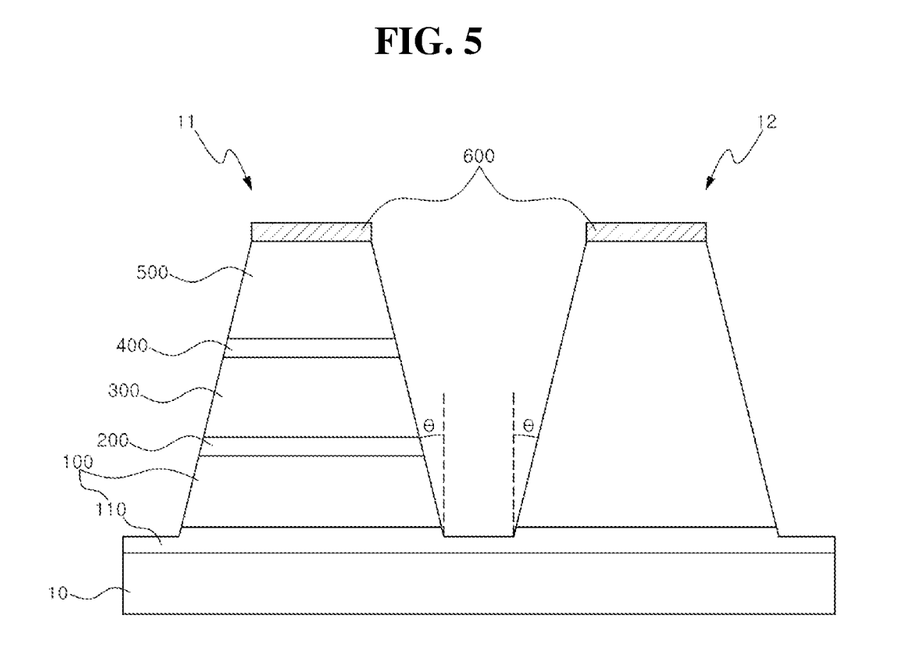

FIGS. 4 and 5 are cross-sectional views illustrating a manufacturing process of the unit pixel in FIG. 1 according to a first embodiment of the present disclosure.

Referring to FIG. 4, a first sub-pixel 100, a first current blocking layer 200, a second sub-pixel 300, a second current blocking layer 400 and a third sub-pixel 500 are formed on the growth substrate 10 using an MOCVD process. The detailed configuration of each of the sub-pixels 100, 300, and 500 is the same as described in FIG. 1 above.

In addition, when the third sub-pixel 500 has an AlInGaP material, an MOCVD process and a pixel-bonding process are used. That is, the first sub-pixel 100, the first current blocking layer 200, and the second sub-pixel 300 are formed through an MOCVD process. In addition, the third sub-pixel 500 is formed using another growth substrate which may be GaAs. Thereafter, the third sub-pixel 500 is bonded to the second sub-pixel 300 with an insulating adhesive. The insulating adhesive also functions as the second current blocking layer 400. When the third sub-pixel 500 is bonded on the second sub-pixel 300, the GaAs substrate is removed to form the stacked structure disclosed in FIG. 4 above.

Subsequently, a mask pattern 600 is formed on the third sub-pixel 500. The mask pattern 600 serves as an etching mask. The mask pattern 600 may be formed of silicon nitride or silicon oxide. Any material capable of maintaining physical properties in a subsequent etching process may be suitable for the mask pattern 600. Accordingly, in addition to the material of the mask pattern 600 described above, a mask pattern 600 made of Cr may be used, and photoresist may also be used as the mask pattern 600.

Referring to FIG. 5, the structure of FIG. 4 is etched using Inductively Coupled Plasma (ICP)-Reactive Ion Etching (RIE).

$BCl_3/Cl_2$ is used as the plasma source. Depending on the molar ratio of the plasma source $BCl_3/Cl_2$, the characteristics of chemical etching or physical etching are controlled. Chemical etching refers to a plasma source in contact with materials to perform etching according to a chemical surface reaction, and physical etching refers to a plasma source removing parts of materials via physical sputtering induced by directional ion bombardment. In general, when chemical etching characteristic is dominant, etching is performed along a specific face of a crystal structure, and when physical etching characteristic is dominant, an object is etched to have a vertical-sidewall profile.

The $BCl_3$ gas in the $BCl_3/Cl_2$ mixture constituting the plasma source has low reactivity due to a strong interatomic bond and is used for physical etching. In addition, $Cl_2$ is used for chemical etching since etching is activated in a specific crystal plane of GaN having a hexagonal structure or AlInGaP.

In this embodiment, it is preferred that the molar ratio of $BCl_3:Cl_2$ has a ratio of 0:1 to 0.2:0.8. When the molar ratio is more than 0.2:0.8, the increased fraction of $BCl_3$ results in a profile with vertically etched sidewalls due to stronger physical etching, other than the semi-polar plane. In addition, because the molar ratio of $Cl_2$ in the plasma source is significantly higher compared to $BCl_3$, chemical etching characteristic is dominant in the ICP-RIE process. That is, etching occurs in which semi-polar surfaces of the sub-pixels 100, 300, and 500 are exposed by chemical etching. That is, (10-10) plane is exposed on the side surfaces of the unit pixels 11, 12. For example, in the case of GaN, the (10-10) plane where Ga and N are simultaneously exposed is exposed.

Theoretically, the (10-10) plane has an inclination angle of 28° with a vertical line that is perpendicular to the growth substrate 10 having the (0001) plane as the upper surface. However, in actual etching, it is formed with an inclination angle of 24° to 29°.

The separation operation of the unit pixels 11, 12 is performed through the above-described process. However, it is preferable that the first n-type semiconductor layer 110 is exposed or partially etched by adjusting the etching time. Through etching, the first n-type semiconductor layer 110 can be configured as a common cathode. Subsequently, the structure of FIG. 1 can be obtained by removing the upper mask pattern 600.

Second Embodiment

Figure 6:
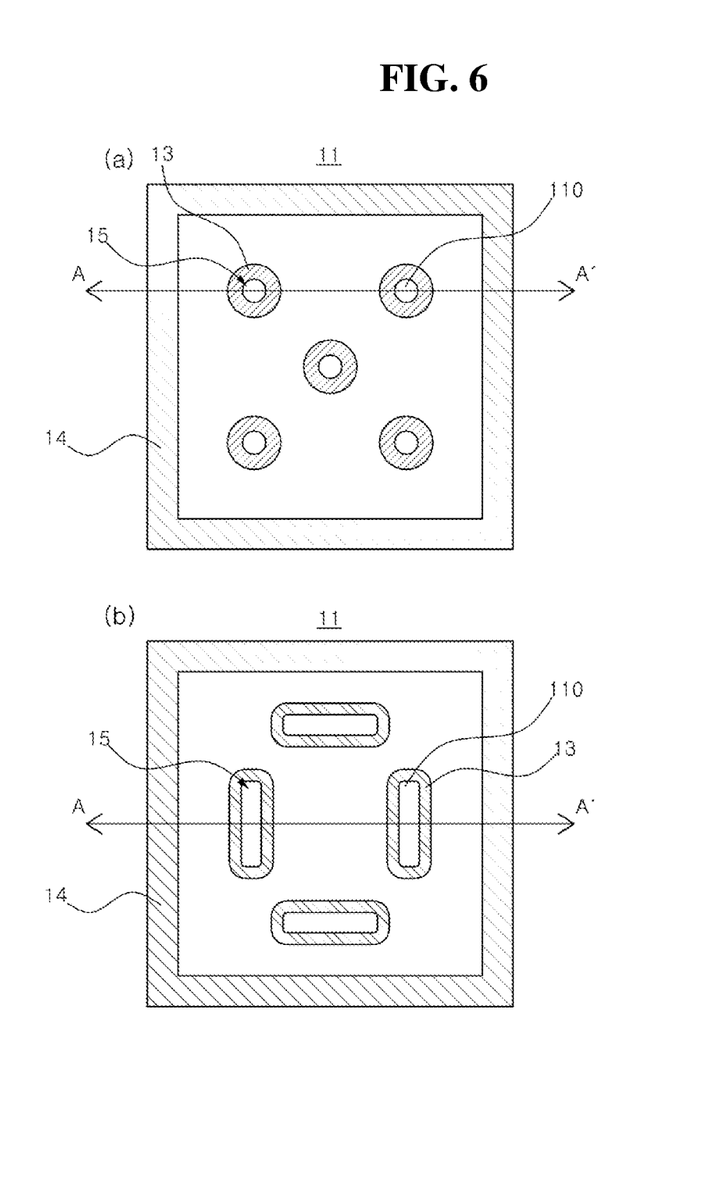
FIG. 6 is a top view of a unit pixel according to a second embodiment of the present disclosure.

FIG. 6 is a top view of a unit pixel according to a second embodiment of the present disclosure.

Referring to FIG. 6, a third sub-pixel is disposed as the top layer of the unit pixel 11. Also, a via hole 15 is formed inside the unit pixel 11. The inner inclined surface 13 is exposed through the via hole 15. In addition, the outer inclined surface 14 is exposed on the outer side of the unit pixel 11 as disclosed in the first embodiment. The inclined surfaces 13, 14 is formed according to ICP-RIE as described in FIG. 5 above. In addition, the via hole 15 penetrates through the third sub-pixel 500, the second current blocking layer 400, the second sub-pixel 300, and the first current blocking layer 200 by ICP-RIE and penetrates a part of the first sub-pixel 100 to expose the n-type semiconductor layer 110.

In addition, various types of unit pixels can be formed. For example, as shown in FIG. 6(a), the via hole 15 may have a circular shape, and as shown in FIG. 6(b), the via hole 15 may have a rectangular or oval shape. In addition, the first n-type semiconductor layer 110 is exposed through the via hole 15.

Figure 7:
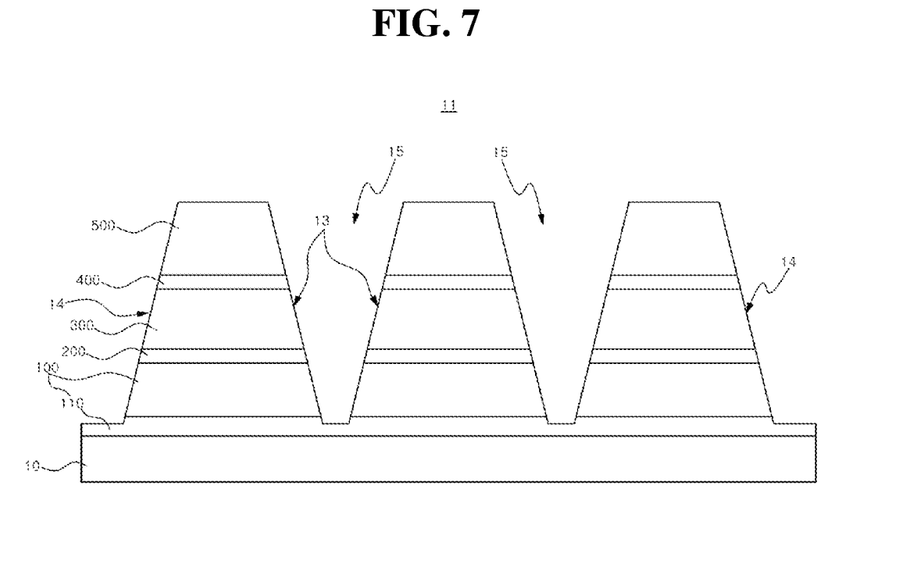
FIG. 7 is a cross-sectional view of the unit pixel in FIG. 6 cut along AA' according to a second embodiment of the present disclosure.

FIG. 7 is a cross-sectional view of the unit pixel of FIG. 6 cut along AA' according to a second embodiment of the present disclosure.

Referring to FIGS. 6 and 7, the via hole 15 is formed in the unit pixel 11 from the upper surface to the lower first n-type semiconductor layer 110. In particular, the via hole 15 is formed with the inclination angle disclosed in FIG. 1.

In addition, the stacked structure of the unit pixel 11 of the present embodiment includes the first sub-pixel 100, the first current blocking layer 200, the second sub-pixel 300, the second current blocking layer 400, and the third sub-pixel 500 formed on the growth substrate 10. The configuration of each sub-pixels 100, 300, 500 and the current blocking layers 200, 400 is the same as described in FIG. 1 of the first embodiment. Therefore, a duplicate description is avoided, and a part where the present embodiment differs from the first embodiment will be mainly described.

In FIGS. 6 and 7, at least one via hole 15 is provided in one unit pixel 11. The inner inclined surface 13 of the unit pixel 11 defining the via hole 15 has an inclination angle θ. The inclination angle θ is defined as an angle formed by a vertical line that is perpendicular to the surface of the growth substrate 10 or the first n-type semiconductor layer 110 and the inner inclined surface 13 or the outer inclined surface 14 of the unit pixel 11. The inclination angle θ of the inner inclined surface 13 of the unit pixel 11 defining the via hole 15 has a value of 24° to 29°. In addition, the inclination angle θ of the inner inclined surface 13 and the inclination angle θ of the outer inclined surface 14 are preferably the same.

The via hole 15 is formed inside the unit pixel 11, and the inner inclined surface 13 defining the via hole 15 has an inclination angle θ. Therefore, most of the light propagating toward the via hole 15 is totally reflected on the inner inclined surface 13, so that high light emission efficiency in the downward direction can be obtained.

In addition, heat generated in the unit pixel 11 by performing the light emission operation can be easily dissipated to the outside through the via hole 15.

In addition, the via hole 15 in FIG. 6 is preferably formed in a circular, rectangular or oval shape. The shape of the via hole 15 depends on the shape of the mask pattern 600 disclosed in FIG. 4 above. When the mask pattern 600 has a circular hole, the formed via hole 15 becomes circular, the area of the third active layer 520 is smaller than the area of the second active layer 340, and the area of the second active layer 340 is smaller than the area of the first active layer 120.

That is, the cross-sectional area of the via hole 15 increases from the growth substrate to the top.

According to the above-described embodiments of the present disclosure, the side surface of the unit pixel has a predetermined inclination angle with respect to a vertical line that is perpendicular to the surface of the growth substrate. Through the inclination angle, the cross-sectional area of the active layer formed at the upper region of the unit pixel is smaller than the cross-sectional area of the active layer formed on the lower region of the unit pixel. The probability that light formed in the active layer is emitted through the side of the unit pixel decreases, and the probability that light is emitted in a direction that is perpendicular to the growth substrate increases significantly. Through above mentioned structure, light emission efficiency in the vertical direction of the unit pixel may be increased.

In addition, in the present disclosure, a via hole is formed in one unit pixel, and the inner sidewall of the via hole has a certain inclination angle. The light emitted to the side is minimized due to the inclination angle formed at the inner sidewall, and light emission efficiency in the vertical direction is increased. In addition, heat generated during the light emission operation is easily dissipated through the via holes, and reliability of the unit pixel is also improved.

The invention claimed is:

1. A unit pixel of micro-display comprising:
a first sub-pixel emitting blue light formed on a growth substrate;
a first current blocking layer formed on the first sub-pixel and blocking leakage current to or from the first sub-pixel;
a second sub-pixel formed on the first current blocking layer and emitting green light;
a second current blocking layer formed on the second sub-pixel and blocking leakage current to or from the second sub-pixel; and
a third sub-pixel formed on the second current blocking layer and emitting red light,
wherein an inclined surface of the first sub-pixel, the second sub-pixel and the third sub-pixel has an inclination angle with respect to a vertical line perpendicular to a plane of the growth substrate and exposed a (10-10) plane, and when light generated in one of the first sub-pixel, the second sub-pixel, or the third sub-pixel is incident on the inclined surface, the light is reflected,
wherein the first sub-pixel has a first n-type semiconductor layer formed on the growth substrate, a first active layer formed on the first n-type semiconductor layer and emitting light, and a first p-type semiconductor layer formed on the first active layer, and
wherein the first n-type semiconductor layer is not separated within the unit pixel and extends to an adjacent unit pixel.

2. The unit pixel of claim 1, wherein the first n-type semiconductor layer is grounded.

3. The unit pixel of claim 1, wherein the first sub-pixel further comprises,
a first tunnel junction layer formed on the first p-type semiconductor layer and supplying a uniform current to the first active layer; and
a first contact layer formed on the first tunnel junction layer and having n-type GaN.

4. The unit pixel of claim 1, wherein the inclination angle is 24° to 29°.

5. The unit pixel of claim 1, wherein the first current blocking layer is formed of p-type GaN.

6. A unit pixel of micro-display comprising:
a first sub-pixel formed on a growth substrate and emitting blue light;
a first current blocking layer formed on the first sub-pixel and blocking leakage current to or from the first sub-pixel;
a second sub-pixel formed on the first current blocking layer and emitting green light;
a second current blocking layer formed on the second sub-pixel and blocking leakage current to or from the second sub-pixel; and
a third sub-pixel formed on the second current blocking layer and emitting red light,
wherein a via hole penetrating layers of the second sub-pixel and layers of the third sub-pixel is formed, an inner inclined surface is formed on a side surface of the via hole, and the inner inclined surface has an inclination angle,
wherein the inclined surface exposes a (10-10) plane,
wherein the first sub-pixel has a first n-type semiconductor layer formed on the growth substrate, a first active layer formed on the first n-type semiconductor layer and emitting light, and a first p-type semiconductor layer formed on the first active layer,
wherein the first n-type semiconductor layer is shared by adjacent unit pixel, and
wherein the via hole exposes the first n-type semiconductor layer.

7. The unit pixel of claim 6, wherein the via hole has a shape of a circle, a square or an oval.

8. The unit pixel of claim 6, wherein an inclination angle of the inner inclined surface is 24° to 29°.

9. The unit pixel of claim 8, wherein an external inclined surface is formed on side surface of the first sub-pixel, the second sub-pixel and the third sub-pixel, and when light formed in at least one of the first sub-pixel, the second sub-pixel, or the third sub-pixel is incident on an external inclined surface, the light is reflected and inclination angle of the inner inclined surface is the same as the inclination angle of the external inclined surface.

10. The unit pixel of claim 6, wherein cross-sectional area of the first sub-pixel is larger than that of the second sub-pixel, and the cross-sectional area of the second sub-pixel is larger than that of the third sub-pixel.

* * * * *